United States Patent [19]

Mizutani et al.

[11] 4,289,188
[45] Sep. 15, 1981

[54] METHOD AND APPARATUS FOR MONITORING ETCHING

[75] Inventors: Tatsumi Mizutani, Kokubunji; Kazuyoshi Ueki, Ohme; Shinya Iida, Tama; Hideo Komatsu, Tokyo, all of Japan

[73] Assignee: Hitachi, Ltd., Tokyo, Japan

[21] Appl. No.: 150,939

[22] Filed: May 19, 1980

[30] Foreign Application Priority Data

May 28, 1979 [JP] Japan .................................. 54/65031

[51] Int. Cl.³ ...................... H01L 21/306; C23F 1/00
[52] U.S. Cl. .................................. 156/626; 156/643; 156/646; 156/665; 204/192 E; 356/416; 356/425; 356/437
[58] Field of Search ............... 156/626, 643, 646, 657, 156/662, 627, 345, 665; 252/79.1; 204/192 E, 298; 250/531; 356/412, 414, 416, 425, 437

[56] References Cited

U.S. PATENT DOCUMENTS 4,198,261  4/1980  Busta et al. .......................... 156/626
4,246,060  1/1981  Keller ................................. 156/345

Primary Examiner—William A. Powell
Attorney, Agent, or Firm—Craig and Antonelli

[57] ABSTRACT

Method and apparatus for monitoring a dry etching process using gas plasma, wherein a ratio of a spectrum intensity which varies depending on the process of the etching process to a spectrum intensity which is independent of the process of the etching process is determined and a resulting signal intensity is monitored. The completion of the etching process can be exactly determined irrespective of variation of the etching conditions.

12 Claims, 3 Drawing Figures

METHOD AND APPARATUS FOR MONITORING ETCHING

The present invention relates to a method and an apparatus for monitoring the process (or proceeding) and the completion of etching in a dry etching process using glow discharge plasma.

In recent years, as the miniturization of electronic components such as semiconductor integrated circuit devices has been developed, a so-called dry etching process using plasma which enables precise and fine working of associated materials has been vigorously developed and partly put into practice. One of the problems encountered in the dry etching process is insufficient reproducibility of etching rate. Causes thereof are difficulty in completely controlling purity of plasmaized gas and variation of surface temperature of a sample to be etched. Because of such variation of etching rate, the dry etching process in many cases needs a monitoring mechanism to determine the process and the completion of the etching process. As examples of the monitoring mechanism, monitoring of emission intensity of a selected wavelength of an emission spectrum of plasma and a mass spectrum method for monitoring ion intensity of a selected mass number have been known for the dry etching process of Al, Al-based alloy, Si and $SiO_2$. It has been found by the study of the inventors of the present invention that when those methods are actually used the emission intensity or the mass spectrum intensity which is sensed for monitoring purpose frequently varies significantly due to the variation of etching parameters such as pressure of gaseous plasma and plasma excited R.F. power. Because of the variations of the emission intensity and the mass spectrum intensity, precise monitoring of the process of etching process is impeded. It has been also found that when the etching process is to be automated by the monitoring mechanism, the completion of the etching process may be erroneously determined by the variations described above.

The following references are cited to show the state of art: (i) Japanese Published Unexamined Patent Application No. 51-104268, (ii) Japanese Published Unexamined Patent Application No. 53-64636, and (iii) Japanese Published Unexamined Patent Application No. 53-34641.

It is an object of the present invention to provide a method and an apparatus for monitoring dry etching process, having a function of correction to exactly monitor the process (or proceeding) and the completion of the etching process regardless of the variation of the etching parameters in monitoring the dry etching process using the emission spectrum or the mass spectrum.

In order to achieve the above object, according to the monitoring method of the present invention, a specific spectrum intensity, which is dependent on the process of the etching process, of atoms or molecules produced in glow discharge plasma during the etching process of a workpiece by ions or radicals generated by the glow discharge plasma, is corrected by another spectrum intensity which is independent of the process of the etching process and the resulting signal intensity is monitored.

The spectrum intensity dependent on the proceeding of the etching process is an emission spectrum intensity of a specific wavelength or a mass spectrum intensity of a specific mass number for use to monitor the etching status, and it may be that heretofore used for monitoring the etching status, that is, a spectrum intensity of atoms or molecules constituting material to be etched or reaction product of etching. For example, when Al is to be dry etched by plasma of compound gas including chlorine atoms, an emission spectrum of Al atoms having the wavelength of 396 nm or an emission spectrum of AlCl molecules havng the wavelength of 261.4 nm, or a mass spectrum of AlCl having the mass number of 62 or a mass spectrum of $AlCl_2$ having the mass number of 97 may be employed.

The spectrum intensity independent of the process of the etching process is usually an emission spectrum intensity or a mass spectrum intensity of atoms or molecules which are independent of atoms or molecules constituting material to be etched or reaction product of etching, with the wavelength or the mass number thereof being different from that of the spectrum which is dependent on the process of the etching process. For example, when Al is to be dry etched by plasma in a gas environment including $CCl_4$, an emission spectrum of Cl atoms having the wavelength of 500 nm or a mass spectrum of $CCl_2$ having the mass number of 72 may be employed. In a simpler case, a whole spectrum intensity of entire wavelength region or entire mass number region may be employed instead of the spectrum intensity of the selected wavelength or mass number.

The etching process in which the workpiece is etched by the ions or radicals generated by the glow discharge plasma utilizes the etching technique known as the plasma etching or sputter etching, and it may also be referred to as the dry etching. When Al is to be etched, it is etched by the ions or radicals generated by the discharge of compound gas including chlorine atoms.

When the emission spectrum is employed for monitoring, a spectrum of a specific wavelength is to be selectively extracted for the measurement of the intensity thereof. A well-known optical filter or diffraction grating may be used for the selection of the spectrum of the specific wavelength.

A simple way to correct the spectrum intensity dependent on the process of etching by the spectrum intensity independent of the process of etching is to use a quotient of the former divided by the latter, that is, a ratio of the former to the latter, although the present invention is not limited to that.

The apparatus for monitoring the etching process may comprise means for measuring the specific spectrum intensity, which is dependent on the process of the etching process, of the atoms or molecules generated in the glow discharge plasma during the course of etching the workpiece by the ions or radicals generated in the glow discharge plasma; means for measuring the spectrum intensity independent of the process of the etching process; and means for producing the corrected value of the spectrum intensity which is derived by correcting the spectrum intensity dependent on the process of the etching process by the spectrum intensity independent of the process of the etching process. The corrected value producing means may be simply implemented by means for producing a ratio of the former intensity to the latter intensity, although the present invention is not limited to that. The spectrum intensity measuring means and the corrected value producing and processing means are well known. The spectro for measuring the intensity and the selection of those spectra have been described above.

The present invention will now be described in conjunction with the accompanying drawings, in which.

Figure 1:
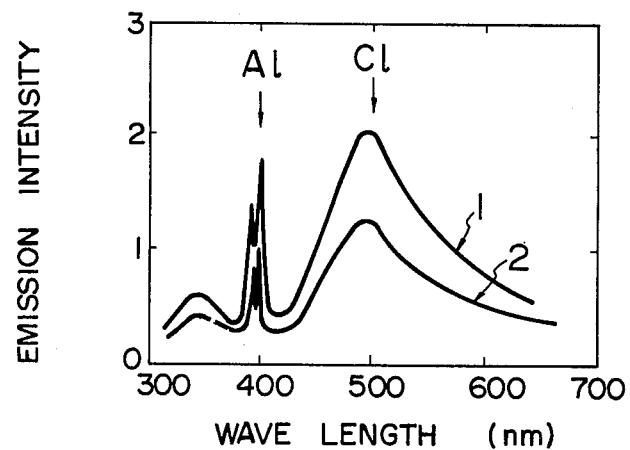
FIG. 1 shows an emission spectrum of plasma when Al is etched by BCl$_3$ gaseous plasma.
Figure 2:
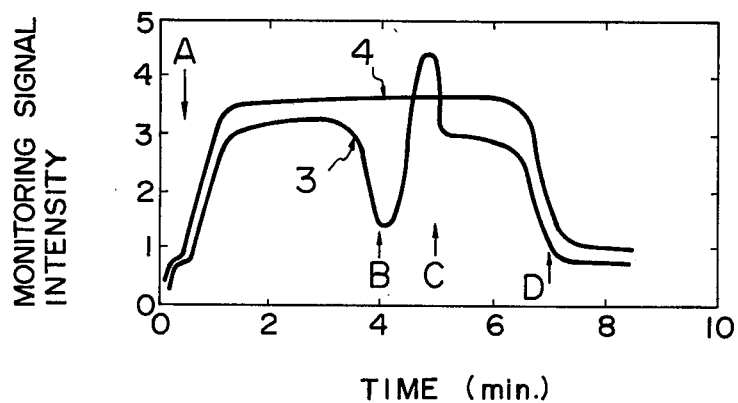
FIG. 2 shows a graph depicting the change of a monitor signal intensity with time when Al is dry etched.

The correction of the monitor signal intensity in accordance with the present invention is now explained in connection with an example in which Al is dry etched by BCl$_3$ gas plasma. A curve 1 shown in FIG. 1 depicts an emission spectrum of the plasma, measured by a spectrophotometer, when Al is dry etched. In the curve 1, the emission spectra at the wavelengths of 394.4 nm and 396.1 nm show the emissions of Al atoms which appear only during the etching process of Al. Therefore, by monitoring the change with time of that emission intensity, the process and the completion of the etching process can be watched. In the curve 1, a broad emission peak near the wavelength of 500 nm shows the emission of Cl atoms or Cl ions. A curve 2 shown in FIG. 2 depicts an emission spectrum when pressure of gas plasma increased during the course of etching process. The emission intensities at the two wave-lengths mentioned above decrease in the curve 2. When the etching parameters such as R.F. power or gas composition vary, the emission spectra also decrease as in the case of the curve 2 or increase over the entire wave-length region. In any case, by monitoring the ratio of the emission intensity at the wavelength of 396.1 nm to the emission intensity at the wavelength of 500 nm, unintended variation of the monitor signal intensity can be suppressed to prevent the earoneous determination of the completion of the etching process. FIG. 2 shows a graph depicting the change of monitor signal intensity with time, inwhich a curve 3 shows a monitor signal intensity taken at the wavelength of 396.1 nm and a curve 4 shows a corrected signal intensity which is a ratio of the emission intensity at the wavelength of 396.1 nm to the emission intensity at the wavelength of 500 nm. In FIG. 2, a time point A indicates the beginning of the etching process, a time period from B to C indicates a pressure varying period and a time point D indicates the completion of the etching process. In the curve 3, the time point B might be erroneously determined as the completion time of the etching process, but in FIG. 4 the is no such probability. In FIGS. 1 and 2, the ordinates may be scaled in any unit.

EXAMPLE 1

Figure 3:
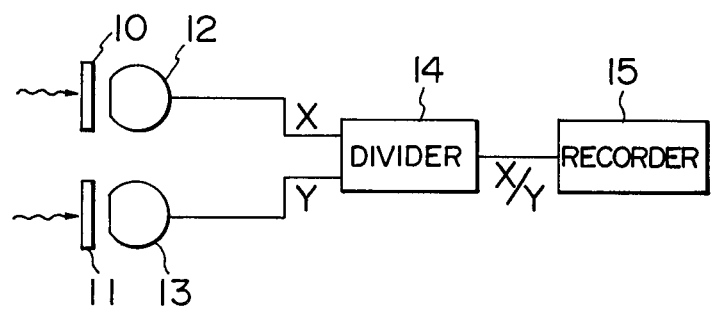
FIG. 3 illustrates a construction of one embodiment of the etching monitoring apparatus of the present invention.

Al was etched by BCl$_3$ gas plasma. During the etching process, a signal intensity which is a ratio of the Al emission intensity (wavelength 396.1 nm) to the Cl emission intensity (wavelength 500 nm) was monitored. A construction of the apparatus for producing the monitor signal is shown in FIG. 3, which comprises an interference filter 10 which transmits a light at the wavelength of 396 nm, an interference filter 11 which transmits a light at the wavelength of 500 nm, opto-electronic transducers 12 and 13 for transducing the respective light intensities to electric signal intensities X and Y, respectively, a divider 14 for producing a ratio (X/Y) of the output of the opto-electronic transducer 12 to the output of the opto-electronic transducer 13 and a recorder 15 for recording the output from the divider 14. When the output of the divider 14 is used for automation operation, the recorder 15 is not necessarily required. The change of the monitor signal with time recorded in the recorder 15 depicted a curve which enabled the exact determination of the completion of the etching process despite of the variation of the R.F. power and the pressure in the course of the Al etching process.

EXAMPLE 2

Al was etched by CCl$_4$ gas plasma. Etching reaction products AlCl (mass number 62) and CCl$_2$ (mass number 72) were detected by a quadrupole mass filter and a ratio of those signal intensities derived by a divider similar to that used in the example 1 was monitored to determine the process and the completion of the Al etching process. In the present example, like in the example 1, the completion of the etching process could be exactly determined.

As described hereinabove, according to the present invention, the process of the etching process can be exactly monitored during the dry etching process despite the variation of the etching conditions and hence the present invention may be advantageously applied to the automated process which needs exact determination of the completion of the etching process. While the Al etchng process was particularly explained, the apparatus of the present invention is equally applicable to the etching process of any other materials such as Si, SiO$_2$ and Si$_3$N$_4$. While the Cl emission intensity at the wavelength of 500 nm was shown as the reference signal for correction when the emission spectrum was monitored, a similar effect may be attained when the emission intensity (or even the emission intensity of the entire wavelength rather than the spectrum intensity) of atoms, molecules or ions of those other than etching reaction products, such as Al and AlCl. In this case, it should be noted that the response times of the pair of opto-electronic transducers must be equal. If the response times differ from each other, exact correction of the monitor signal cannot be attained.

Obviously, many modifications and variations of the present invention are possible in the light of the above teachings. It is therefore to be understood that within the scope of the appended claims the invention may be practicesed otherwise than as specifically described.

What is claimed is:

1. A method for monitoring etching process for etching a workpiece by ions or radical sproduced by glow display plasma, comprising the steps of:
    correcting a specific spectrum intensity, which is dependent on the process of said etching process, of atoms or molecules produced in said plasma by another spectrum intensity which is independent of the process of said etching process; and
    monitoring a resulting signal intensity.

2. A method according to claim 1, wherein said spectrum intensity dependent on the process of said etching process and said spectrum intensity independent of the process of said etching process are an emission spectrum intensity at a specific wavelength and an emission spectrum intensity at another wavelength, respectively.

3. A method according to claim 1, wherein said spectrum intensity dependent on the process of said etching process and said spectrum intensity independent of the process of said etching process are a mass spectrum intensity of a specific mass number and a mass spectrum intensity of another mass number, respectively.

4. A method according to claim 2, wherein said spectrum intensity dependent on the process of said etching process is a plasma emission spectrum intensity at a specific wavelength selected through an optical filter or a diffraction grating, and said spectrum intensity independent of the process of said etching process is a plasma emission spectrum intensity at another wavelength selected through an optical filter or a diffraction grating.

5. A method according to claim 1, 2, 3 or 4, wherein a ratio of said spectrum intensity dependent on the process of said etching process to said spectrum intensity independent of the process of said etching process is monitored.

6. A method according to claim 5, wherein a ratio of a spectrum intensity of Al atoms or AlCl molecules to a spectrum intensity of Cl atoms is monitored, said Al atoms or AlCl molecules and Cl atoms being produced in the course of etching Al or Al-based alloy using plasma of compound gas including chlorine atoms.

7. An apparatus for monitoring etching process for etching a workpiece by ions or radicals produced by glow discharge plasma, comprising:
  means for measuring a specific spectrum intensity, which is dependent on the process of said etching process, of atoms or molecules produced in said plasma;
  means for measuring a spectrum intensity independent of the process of said etching process; and
  means for producing a corrected spectrum intensity, said corrected spectrum intensity being generated by correcting said spectrum intensity dependent on the process of said etching process by said spectrum intensity independent of the process of said etching process.

8. An apparatus according to claim 7, wherein said spectrum intensity dependent on the process of said etching process and said spectrum intensity independent of the process of said etching process are an emission spectrum at a specific wavelength and an emission spectrum at another wavelength, respectively.

9. An apparatus according to claim 7, wherein said spectrum intensity dependent on the process of said etching process and said spectrum intensity independent of the process of said etching process are a mass spectrum of a specific mass number and a mass spectrum of another mass number, respectively.

10. An apparatus according to claim 8, wherein said means for measuring the spectrum intensity dependent on the process of said etching process includes an optical filter or diffraction grating for selecting the emission spectrum of said specific wavelength and means for measuring the selected spectrum intensity, and said means for measuring the spectrum intensity independent of the process of said etching process includes an optical filter or diffraction grating for selecting the emission spectrum of said another wavelength and means for measuring the selected spectrum intensity.

11. An apparatus according to claim 7, 8, 9 or 10, wherein said means for producing the corrected spectrum intensity includes means for calculating a ratio of said spectrum intensity dependent on the process of said etching process to said spectrum intensity independent of the process of said etching process.

12. An apparatus according to claim 11, including means for measuring a spectrum intensity of Al atoms or AlCl molecules and means for measuring a spectrum intensity of Cl atoms, said Al atoms or AlCl molecules and said Cl atoms being produced in the course of etching Al or Al-based alloy using plasma of compound gas including chlorine atoms, and means for calculating a ratio of said two spectrum intensities.

* * * * *